(12) United States Patent
Contrata

(10) Patent No.: US 6,172,513 B1
(45) Date of Patent: Jan. 9, 2001

(54) METHOD FOR ANALYZING ELECTRICAL CONTACT BETWEEN TWO CONDUCTIVE MEMBERS OF SEMICONDUCTOR DEVICE WITHOUT DESTRUCTION THEREOF

(75) Inventor: Walter Contrata, Tokyo (JP)

(73) Assignee: NEC Corporation, Tokyo (JP)

(*) Notice: Under 35 U.S.C. 154(b), the term of this patent shall be extended for 0 days.

(21) Appl. No.: 09/260,050

(22) Filed: Mar. 2, 1999

(30) Foreign Application Priority Data

Mar. 2, 1998 (JP) .................................. 10-049692

(51) Int. Cl.[7] .................................. G01R 31/28
(52) U.S. Cl. .................. 324/756; 324/765; 324/755; 324/158.1
(58) Field of Search .................. 324/765, 755, 324/754, 158.1, 756

(56) References Cited

U.S. PATENT DOCUMENTS

| | | | |
|---|---|---|---|
| H111 | * 8/1986 | Flesner | 324/158.1 |
| 4,896,108 | * 1/1990 | Lynch et al. | 324/158.1 |
| 5,838,161 | * 11/1998 | Akram et al. | 324/755 |
| 5,903,164 | * 5/1999 | Kline | 324/765 |

OTHER PUBLICATIONS

Y. Hiraoka et al., "Two–Dimensional Analysis of Emitter–Size Effect on Current Gain for GaAlAs/GaAs HBT's", IEEE Transactions on Electron Devices, vol. ED–34, No. 4, Apr. 1987, pp. 721–725.

* cited by examiner

*Primary Examiner*—Safet Metjahic
*Assistant Examiner*—Jimmy Nguyen
(74) *Attorney, Agent, or Firm*—Sughrue, Mion, Zinn Macpeak & Seas, PLLC

(57) ABSTRACT

A Schottky contact of a heterojunction field effect transistor is expressed by a set of regional elements each representative of a line or a region of said Schottky contact, and current components respectively passing through the regional elements are expressed as $$I(R1, R2, \cdots, R_N) = \sum_{k=1}^{N} J_k R_k$$

where I is a gate current current, $R_k$ is a length of the line or an area of the region, N is equal to or greater than 3 and $J_k$ is a current density of one of the current components so that an analyst checks the current components to see whether or not the Schottky contact has a trouble.

3 Claims, 11 Drawing Sheets

METHOD FOR ANALYZING ELECTRICAL CONTACT BETWEEN TWO CONDUCTIVE MEMBERS OF SEMICONDUCTOR DEVICE WITHOUT DESTRUCTION THEREOF

FIELD OF THE INVENTION

This invention relates to a diagnosing technology for semiconductor devices and, more particularly, to a method for analyzing a contact between an electrode and a conductive layer incorporated in a semiconductor device without destruction thereof.

DESCRIPTION OF THE RELATED ART

Various kinds of contact are incorporated in semiconductor devices. These kinds of contact are broken down into two categories. The first category is called an ohmic contact, and exhibits a low resistance against electric current. The second category exhibits abrupt current-to-voltage characteristics, and typical examples are known as a Schottky junction and a p-n junction.

The contact in the second category is, by way of example, used for a gate electrode of a field effect transistor. The structure and operating principle of an field effect transistor will be explained with reference to FIG. 1, which is a top view of a heterojunction field effect transistor. Parallel to the plane of the figure, a Schottky barrier layer 1 of GaAlAs is provided over a heterojunction between an electron supply layer of GaAlAs and a channel layer of InGaAs, and is covered with a contact layer 3 of GaAs. A gate recess 4 is formed by removing the contact layer 3, exposing the Schottky barrier layer 1. A gate electrode 5 of Ti/Au/Pt alloy is formed in the gate recess 4 on the Schottky barrier layer 1. A source electrode 6 of AuGe/Au alloy and a drain electrode 7 of AuGe/Au alloy are provided on both sides of the gate electrode 5, and are electrically connected to the channel layer. By applying appropriate voltage bias to the gate, electrical current between the source electrode 6 and the drain electrode 7 can be switched on and off.

Various reasons for analyzing contacts and methods of doing so in the prior art will be illustrated, using the gate contact as an example.

In operation, an electrical current, known as gate current, flows between the gate electrode and source or drain electrodes. This gate current degrades performance, and the manufacturer must control production so that the gate current lies within user specifications. FIG. 2 illustrates the gate current as a function of bias voltage between gate and source electrodes. The solid line R1 represents the gate current of a product which meets user specifications. The dashed line D1 represents the gate current of a product which is defective, because the gate current exceeds user specifications. In the latter case, the manufacturer must analyze the product to ascertain the cause of high gate current, and arrange future production so that the gate current is within specifications.

In the prior art, scanning electron microscopy is a typical method of analysis. In scanning electron microscopy, the product is cleaved and observed in cross section, as illustrated in FIG. 3, which is a cross section of a defective product taken along line A—A of FIG. 1. Although the source/ drain electrodes 6/7 are not shown in FIG. 3, the heterojunction, the Schottky barrier layer and the contact layer are labeled with the same references, and other references 8, 9, 10 and 11 designate a substrate of GaAs, a buffer layer of GaAlAs, the channel layer of InGaAs and the electron supply layer of GaAlAs, respectively. If, as shown in FIG. 3, the gate recess 4 is too narrow to space the gate electrode 5 from the contact layer 3, the gate electrode 5 is brought into contact with the contact layer 3, leakage current flows from the gate electrode 5 to the contact layer 3, and the gate current is varied along the dotted line D1. The manufacturer must then arrange future production so that the gate electrode 5 is not brought into contact with the contact layer 3.

Another prior art method of analysis is secondary ion mass spectroscopy. Secondary ion mass spectroscopy measures the concentration of elements in the product. FIG. 4 illustrates the actual aluminum and silicon concentration as a function of depth from the upper surface of a defective product, measured by secondary ion mass spectroscopy. In addition, the silicon concentration is designed as indicated by plots PL1. The design silicon concentration is low in the Schottky barrier layer 1 from depth D1 to depth D2, and is high in the electron supply layer 11 from depth D2 to depth D3. The actual aluminum concentration is increased between depth D1 to depth D3, i.e., in both Schottky barrier and electron supply layers 1/11. However, the actual silicon concentration is increased in the Schottky barrier layer 1. The large silicon concentration in the Schottky barrier layer 1 is causative of high gate current as indicated by dotted line D1. Thus, there are various origins of unusual bias voltage-to-gate current characteristics, and the manufacturer ascertains the origin through the analysis of the contact.

Another reason for the analysis of a contact is to influence of a design change. For example, in order to increase the operating frequency of a circuit, the circuit designer typically replaces the field effect transistor with one of shorter gate length. However, the remainder of the circuit must be redesigned appropriately for the new field effect transistor. However, redesign is not possible until the characteristics of the new field effect transistor are known. The circuit designer can wait until the new field effect transistor is fabricated, and measure the characteristics. However, methods which can predict the characteristics before fabrication result in a savings of time.

In addition, the dimensions of a gate electrode may be unintentionally changed. For example, if the kind of photo-resist used in gate fabrication is found to be undesirable from the aspect of environment, the manufacture changes the photo-resist to another kind of photo-resist. The new photo-resist may be different in pattern transfer characteristics from the previous photo-resist. This means that the new photo-resist unintentionally changes the dimensions of the gate electrode. When the manufacturer wants to maintain the original dimensions of the gate electrode, the manufacturer is required to change the parameters of the photo-lithography. In the prior art, the manufacturer carefully determines the parameters of the photo-lithography, using the scanning electron microscope to measure the gate length.

Thus, the manufacturer evaluates the voltage-to-current characteristics of an electrode by using a testing system, and observes the microstructure of the electrode through the scanning electron microscope and the secondary ion mass spectroscopy. The testing system, the scanning electron microscope and the secondary ion mass spectroscopy are useful for the manufacturer. However, those apparatus are expensive, and the analysis requires a large amount of time and labor. Moreover, the product is to be broken before the observation through the scanning electron microscope and the secondary ion mass spectroscope. The manufacture can not freely analyze products of the semiconductor device. A non-destructive analyzing method is desirable.

A non-destructive analyzing method is disclosed by, for example, Hiraoka et. al. in IEEE Transactions on Electron Devices, vol. ED-34, No. 4, April 1987, page 721. This prior art non-destructive analyzing method-is hereinbelow described with reference to FIGS. 5 and 6. FIG. 5 is a top view of an n-p-n bipolar transistor, and FIG. 6 is a circuit schematic of the same. The n-p-n bipolar transistor is assumed to have an emitter contact 21, a base contact 22 and a collector contact 23. Though not shown in FIG. 5, a base region is formed in a collector region, and an emitter region is nested in the base region. An emitter electrode 24, a base electrode 25 and a collector electrode 26 are held in contact with the emitter region, the base region and the collector region, respectively, and the emitter contact 21, the base contact 22 and the collector contact 23 are formed between the emitter region and the emitter electrode 24, between the base region and the base electrode 25 and between the collector region and the collector electrode 26. The emitter-base junction has the width W and the length L.

The n-p-n bipolar transistor is connected at the collector electrode 26 to a collector bias source VC and at the emitter electrode 24 to the ground. When the base electrode 25 is forwardly biased, a small amount of base current IB flows from the base region into the emitter region, and a large amount of collector current IC flows from the collector region through the base region into the emitter region. The collector current IC is expressed as $$IC = \beta \, IB \quad \text{Equation 1}$$

Where β (beta) is current amplification factor. The collector current IB is proportional to the width W and the area of the emitter-base junction LW, and is expressed as $$IB = \sigma BLW + \lambda W \quad \text{Equation 2}$$

Where σB (sigma-B) and λ (lambda) are constants of proportionality and represent a current density relating to the area and the length. From equations 1 and 2, we obtain $$1/\beta = IB/IC = (\sigma B/\sigma C) + (1/L)(\lambda/\sigma C) \quad \text{Equation 3}$$

In equation 3, $\sigma C \equiv IC/LW$. When $(1/\beta)$ is plotted as a function of $(1/L)$ under the condition that a σC is constant, plots form a linear line R2 as shown in FIG. 7. The current density λ and a σB are determined on the basis of the gradient (λ/σC) and the intercept (σB/σC) on the axis of ordinates. Thus, the analyst can evaluate the emitter contact 21 without destruction of the n-p-n bipolar transistor. For example, if a bipolar transistor has a large value of λ, the analyst may infer that there is a leak path for current along the contact edge.

The prior art non-destructive analysis does not consume the time and labor so much as the prior art destructive analysis using the scanning electron beam microscope and the secondary ion mass spectroscopy, and the cost is lower than that of the prior art destructive analysis. However, the prior art non-destructive analysis has some problems. First, the prior art non-destructive analysis is limited to a bipolar transistor. Second, the evaluation is less reliable, because actual base current may have more components than are represented by the two terms in Equation 2. In this case, it may not be possible to determine the location of a leak path.

SUMMARY OF THE INVENTION

It is therefore an important object of the present invention to provide a method for economically reliably analyzing a contact incorporated in a semiconductor device having more than two current components.

In accordance with one aspect of the present invention, there is provided a method for analyzing a contact between different component members incorporated in a semiconductor device, and the method comprises the steps of a) preparing samples of a semiconductor each device having component members and a contact formed between component members with varying geometry, b) dividing the contact into a set of regional elements each representative of a line or a region forming a part of the contact, fitting a current passing through the contact to the following equation as a linear function of $R_k$ under a fixed biasing condition $$I(R1, R2, \cdots, RN) = \sum_{k=1}^{N} J_k R_k$$

where I is the current, $R_k$ is a length of the line or an area of the region, N is equal to or greater than 3 and $J_k$ is a current density passing through one of the regional elements represented by $W_k$, and d) determining current components of the current respectively each passing through the line or the region so as to analyze the contact.

In accordance with another aspect of the present invention, there is provided a method for analyzing a contact between different component members incorporated in a semiconductor device, and the method comprises the steps of a) preparing samples of a semiconductor each device having component members and a contact formed between component members, b) dividing the contact into a set of regional elements each representative of a line or a region forming a part of the contact, c) fitting a current passing through the contact to the following equation as a linear function of $R_k$ under a fixed biasing condition $$I(R1, R2, \cdots, R_N) = \sum_{k=1}^{N} J_k R_k$$

where I is the current, $R_k$ is a length of the line or an area of the region, N is equal to or greater than 3 and $J_k$ is a current density passing through one of the regional elements represented by $W_k$, and d) determining the length or the area of one of the regional elements on the basis of following equation $$R1 = J_1^{-1} \sum_{i=2}^{N} J_i R_i$$

where $R_2$ to $R_N$ are known and $J_1$ to $J_N$ are determined at the step c).

BRIEF DESCRIPTION OF THE DRAWINGS

The features and advantages of the method and the information storage medium will be more clearly understood from the following description taken in conjunction with the accompanying drawings in which.

DESCRIPTION OF THE PREFERRED EMBODIMENTS

First Embodiment

Figure 1:
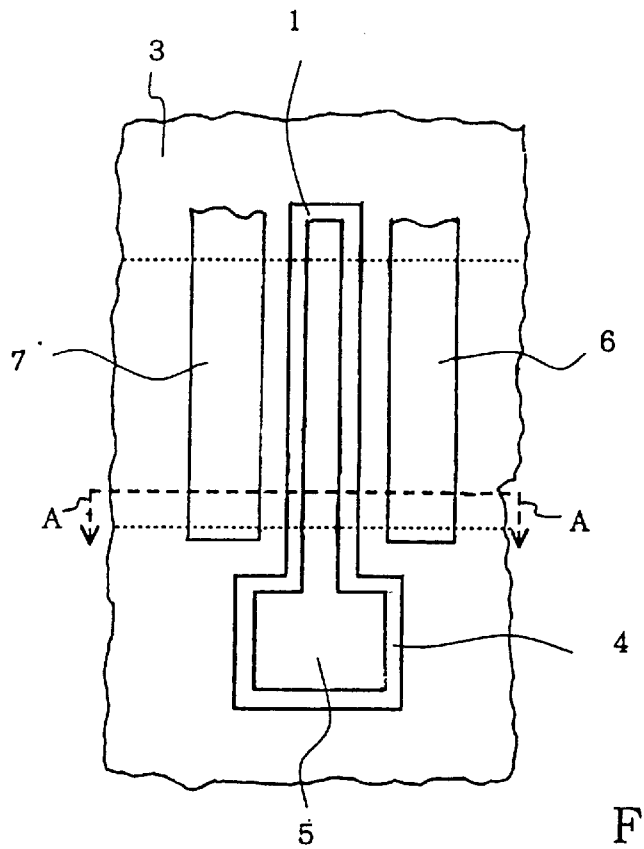
FIG. 1 is a plane view showing the prior art heterojunction field effect transistor.
Figure 2:
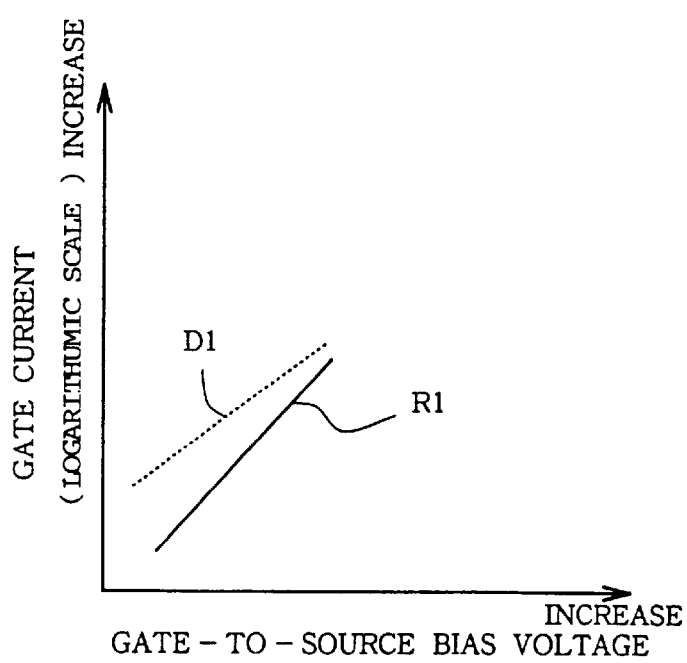
FIG. 2 is a graph showing the transistor characteristics between the gate-source bias voltage and the gate current.
Figure 3:
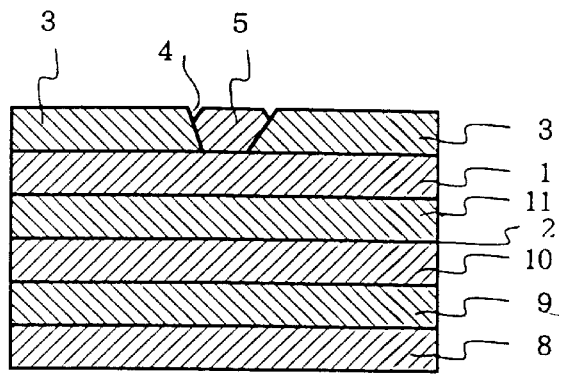
FIG. 3 is a cross sectional view taken along line A—A of FIG. 1 and showing the structure of the prior art heterojunction field effect transistor.
Figure 4:
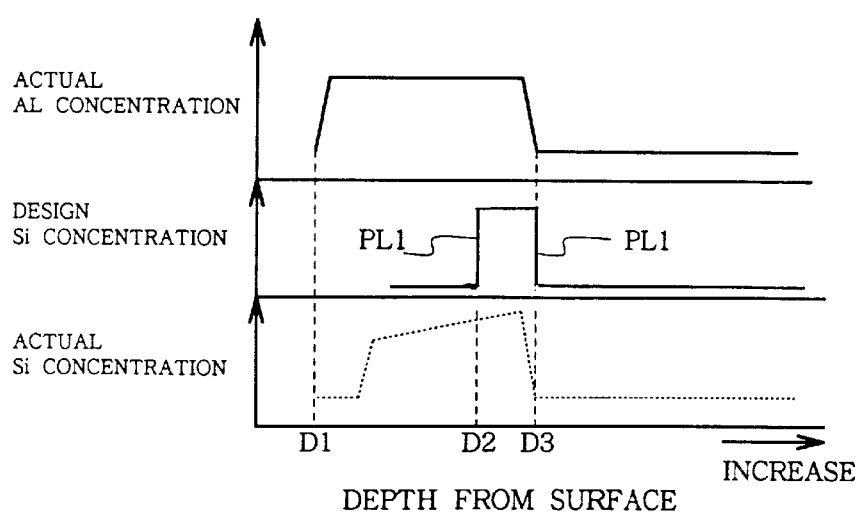
FIG. 4 is a graph showing the aluminum concentration and the silicon concentration in terms of the depth from the upper surface of the product.
Figure 5:
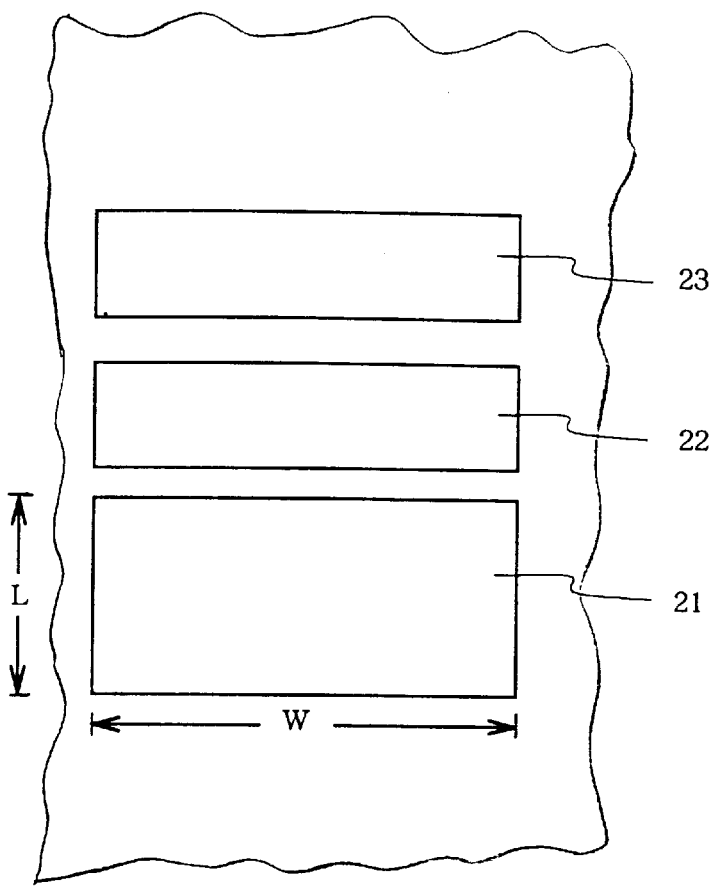
FIG. 5 is a plane view showing the layout of contacts incorporated in the prior art bipolar transistor.
Figure 6:
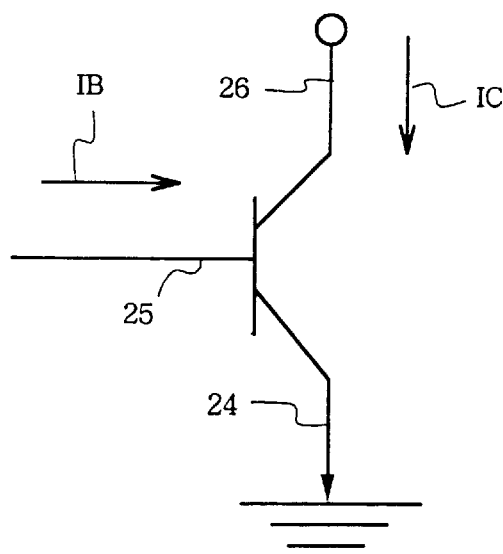
FIG. 6 is a symbol representative of the prior art bipolar transistor.
Figure 7:
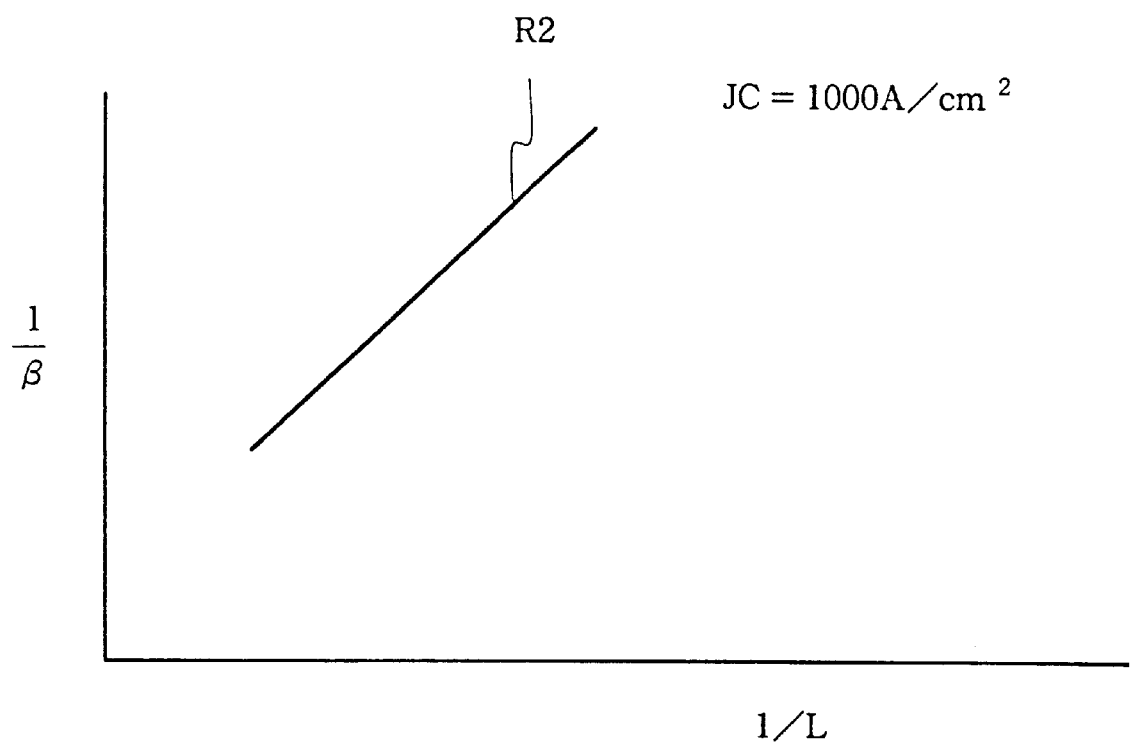
FIG. 7 is a graph showing the relation between the inverse of current amplification factor and the inverse of emitter length.
Figure 8:
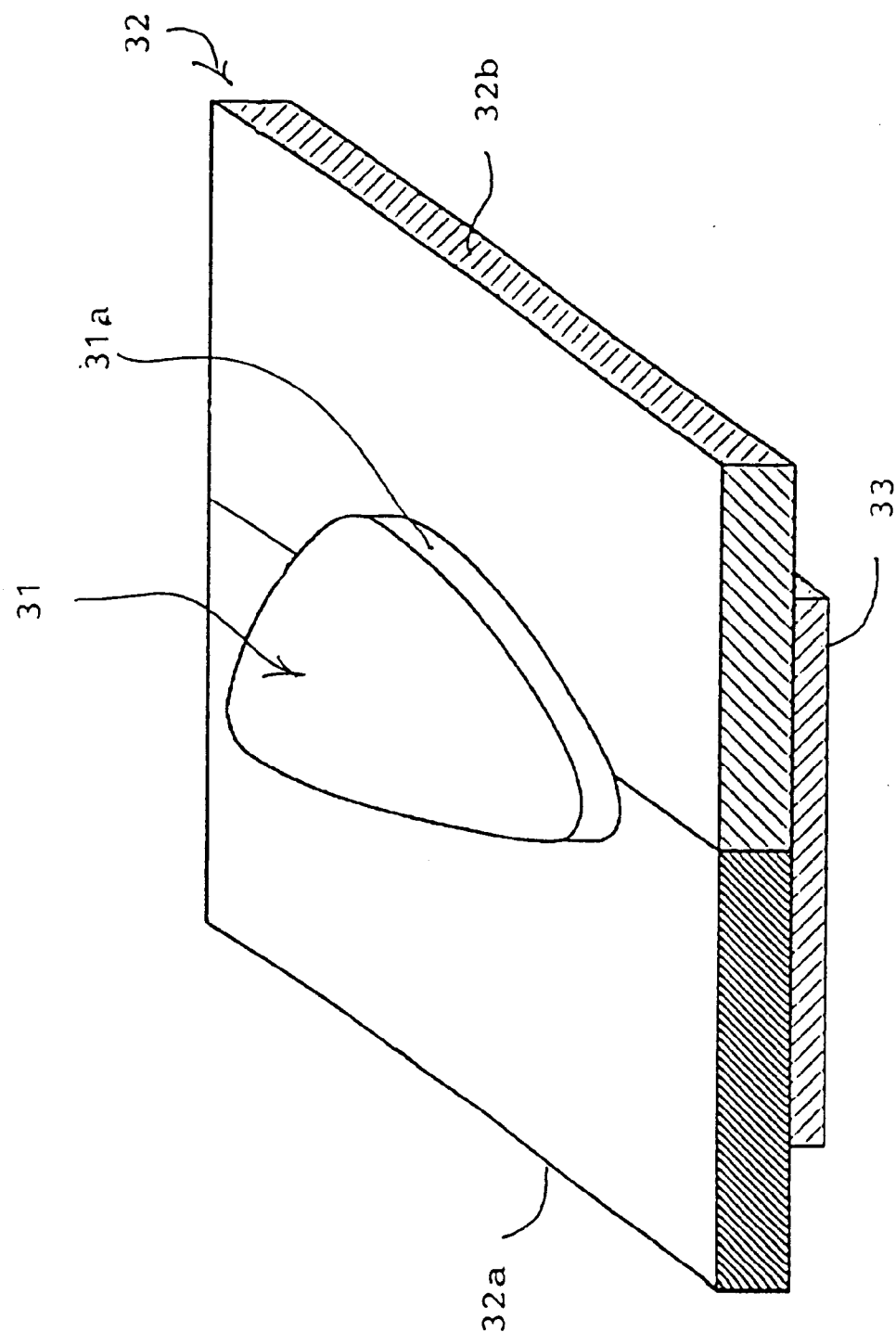
FIG. 8 is a perspective view showing the structure of a Schottky contact which is analyzed through a method according to the present invention.

Referring to FIG. 8 of the drawings, an aluminum electrode 31 is held in contact with an upper surface of a compound semiconductor substrate 32 of silicon-doped GaAs. The compound semiconductor substrate 32 has a lightly-doped region 32a and a heavily-doped region 32b, and the dopant concentration is 1E18/cubic centimeter in the lightly-doped region 32a and 2E18/cubic centimeter in the heavily-doped region 32b. The aluminum electrode 31 is located on the boundary between the lightly-doped region 32a and the heavily-doped region 32b, and, accordingly, is held in contact with both regions 32a/32b. The aluminum electrode 31 has a curved side surface 31a. A low-resistance Au/GeAu electrode 33 is held in contact with the lower surface of the compound semiconductor substrate 32, and is also held in contact with both regions 32a/32b.

When appropriate bias voltage is applied between the aluminum electrode 31 and the Au/GeAu electrode 33, carrier exceeds the Schottky barrier between the aluminum electrode 31 and the compound semiconductor substrate 32, and electric current I flows between the aluminum electrode 31 and the Au/GeAu electrode 33.

Figures 9A, 9B, 9C:
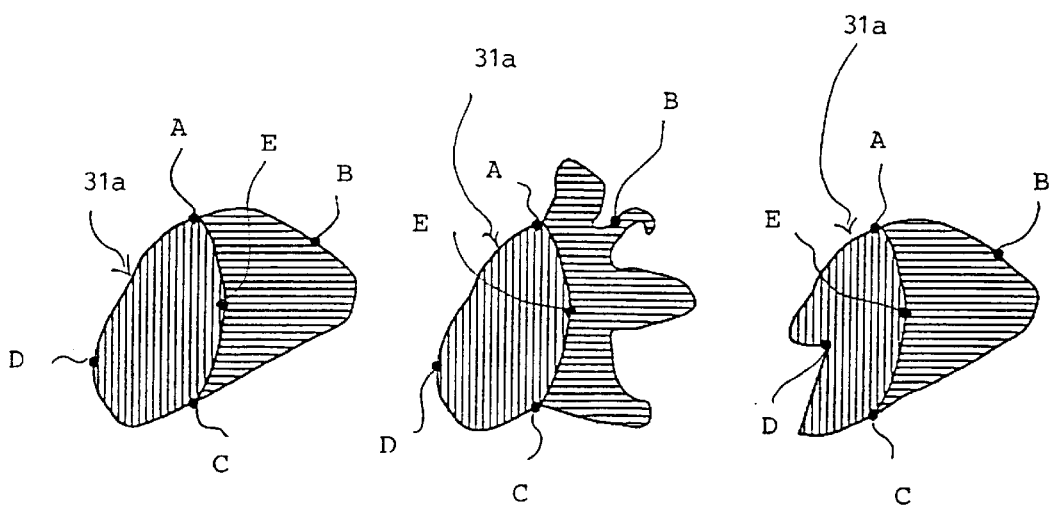
FIGS. 9A, 9B and 9C are plane views showing contours of an aluminum electrode forming the Schottky contact.
Figure 10:
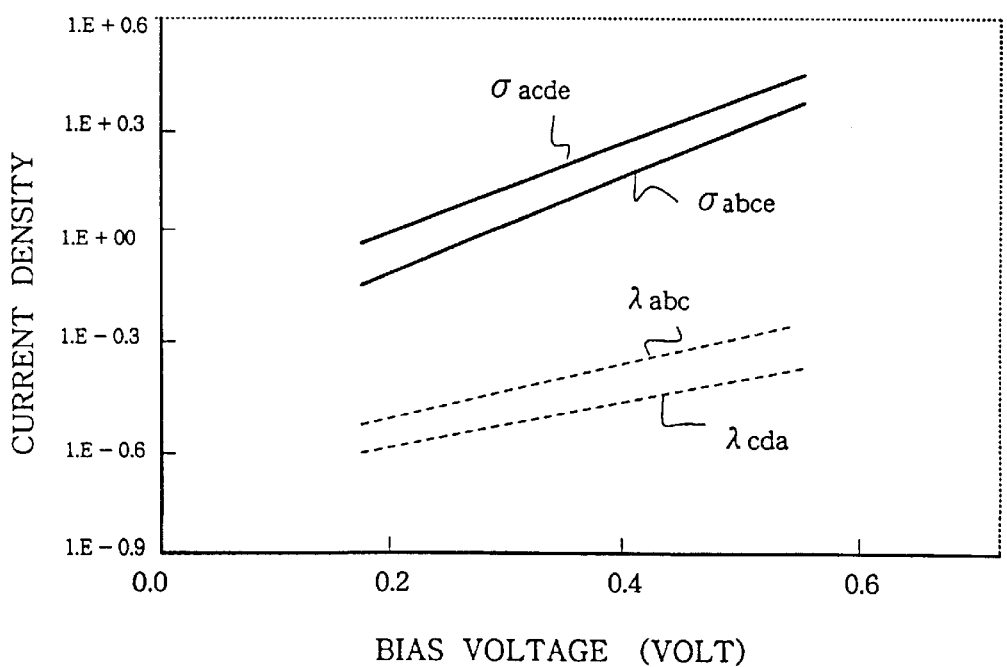
FIG. 10 is a graph showing the relation between current densities of component currents and a bias voltage.

Samples of the aluminum electrode 31 were formed with various contours. FIGS. 9A, 9B and 9C show schematic top views of some contours. Points A, B, C, and D are on the contour, and points A and C are at the crossing points between the contour and the boundary between the lightly-doped region 32a and the heavily-doped region 32b. Point E is on the boundary between the lightly-doped region 32a and the heavily-doped region 32b. The curved line ABCE defines a contact area between the aluminum electrode 31 and the heavily-doped region 32b, and the curved line CDAE also defiles a contact area between the aluminum electrode 31 and the lightly-doped region 32a. These contact areas are hereinbelow represented by the curved lines ABCE and CDAE, and are simply referred to as "area ABCE" and "area CDAE", respectively.

For each sample of the aluminum electrode 31, bias voltage was applied between the aluminum electrode and the Au/GeAu electrode 33, and the resulting current was measured. In this way, the dependence of current on electrode size and shape is determined. The current is analyzed as follows. A portion of the current I flows through the contact area ABCE into the heavily-doped region 32b therebeneath and a second portion flows through the curved line ABC into the heavily-doped region 32b outside thereof. A third portion of the current I further flows through the contact area CDAE into the lightly-doped region 32a therebeneath and a fourth portion flows through the curved line ACD into the lightly-doped region 32a outside thereof. Thus, the current I is broken down into four current components, and is expressed as $$I = f(L_{abc}, L_{cda}, A_{abce}, A_{cdae}) \qquad \text{Equation 4}$$

where $L_{abc}$, $L_{cda}$, $A_{abce}$ and $A_{cdae}$ are the length of the curved line ABC, the length of the curved line CDA, the area of the contact area ABCE and the area of the contact area CDAE. Using current density $\lambda$ (lambda) and $\sigma$ (sigma), equation 4 is rewritten as follows.

$$I = \lambda_{abc} L_{abc} + \lambda_{cda} L_{cda} + \sigma_{abce} A_{abce} + \sigma_{cdae} A_{cdae} \qquad \text{Equation 5}$$

where $\lambda_{abc}$ is the current density of the current component flowing over the curved line ABC, $\lambda_{cda}$ is the current density of the current component flowing over the curved line CDA, $\sigma_{abce}$ is the current density of the current component flowing through the contact area ABCE and $\sigma_{cdae}$ is the current density of the current component flowing through the contact area CDAE. The current densities $\lambda_{abc}$, $\lambda_{cda}$, $\sigma_{abce}$, and $\sigma_{cdae}$ where then determined by fitting Eq. 5 to the measured dependence of current on electrode size and shape by the least squares method.

The principle represented by equation 5 is applicable to any kind of contact. Ti/AlGaAs and Mo/InAlAs may form the metal-semiconductor contact. Metal-insulator-semiconductor structure, a p-n junction and a heterojunction are examples of the other contacts. The contact is broken down into curved lines AB/BC/AC and areas AEB/BEC/CDE, by way of example, and there is not limit on the number of lines and the number of areas. The analyst determines the number of lines and the number of areas depending upon the structure and the fabrication process.

In order to determine a number N of individual current densities $\lambda_{ab}$, $\lambda_{bc}$, . . . $\lambda_{ac}$, $\sigma_{aeb}$, $\sigma_{bec}$, . . . and $\sigma_{ace}$, the necessary/sufficient conditions are that samples of the electrode to be analyzed are formed in a set of N or more shapes, and that the set of shapes contain N linearly independent shapes from the aspect of known theorem of the linear algebra. The term "linearly dependent shapes" means the following vectors obtained from the dimensions of the electrode are linearly independent.

($L^1$ab, $L^1$bc, . . . $L^1$ac, $A^1$aeb, $A^1$bce, . . . $A^1$cde)

($L^2$ab, $L^2$bc, . . . $L^2$ac, $A^2$aeb, $A^2$bce, . . . $A^2$cde)

($L^N$ab, $L^N$bc, . . . $L^N$ac, $A^N$aeb, $A^N$bce, . . . $A^N$cde)

where the superscript is indicative of the electrode shape.

Second Embodiment

Figure 11:
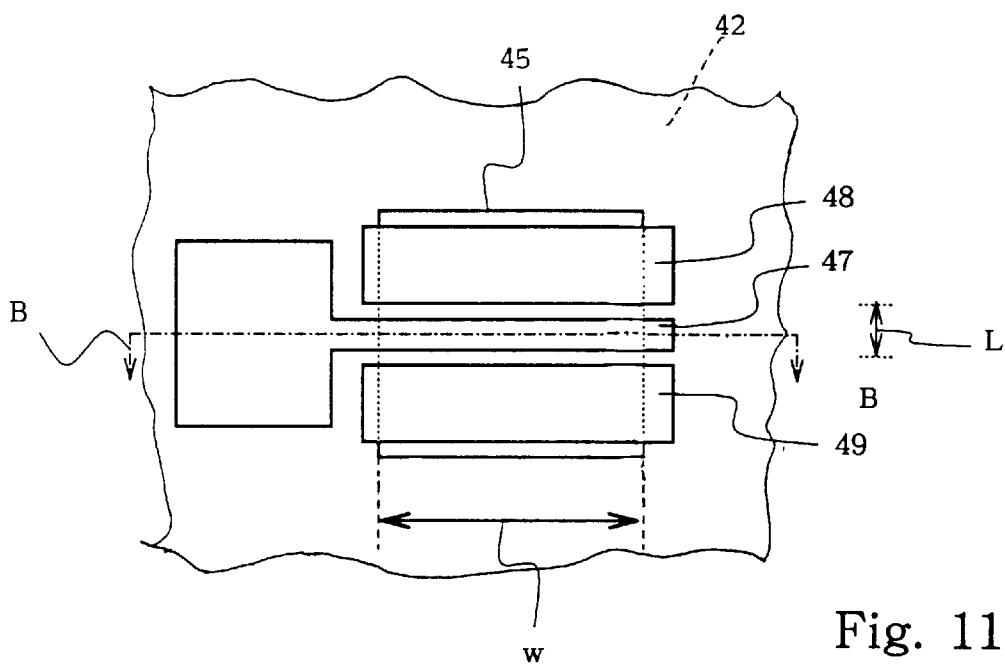
FIG. 11 is a plane view showing the layout of electrodes incorporated in a heterojunction field effect transistor.
Figure 12:
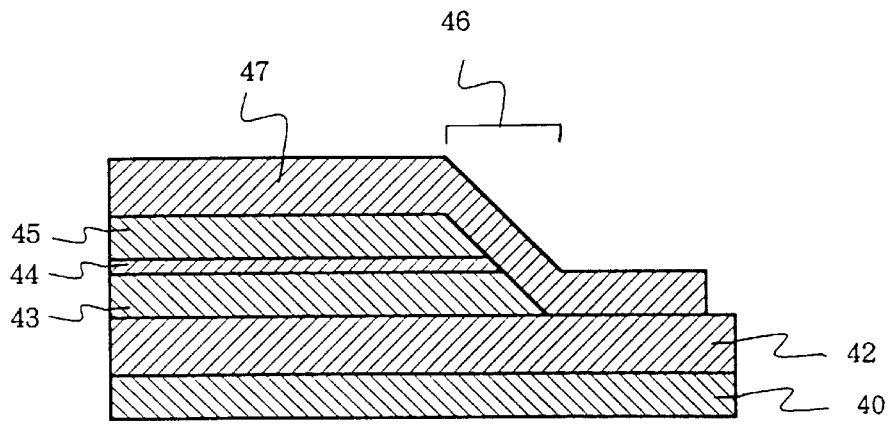
FIG. 12 is a cross sectional view taken along line B—B of FIG. 11 and showing the structure of the heterojunction field effect transistor.

The gate current in a heterojunction field effect transistor is analyzed. FIG. 11 illustrates a schematic top view of the heterojunction field effect transistor, and FIG. 12 illustrates a partial cross section of same along the line BB of FIG. 11. FIG. 12 corresponds to the right hand portion of FIG. 11. A compound semiconductor substrate 40 of InP is covered with a buffer layer 42 of InAlAs, and a channel layer 43 of InGaAs and an electron supply layer 44 are formed on the buffer layer 42. A Schottky layer 45 is laminated on the electron supply layer 44, and the channel layer 43, the electron supply layer 44 and the Schottky layer 45 are partially removed in order to form a mesa insulating structure 46.

A gate electrode 47 is held in contact with the Schottky layer 45, and is formed of Ti/Au/Pt alloy. A source electrode 48 and a drain electrode 49 are formed on both sides of the gate electrode 47, and are formed of AuGe/Au alloy. The gate electrode 47 has width L and length W.

Samples of the heterojunction field effect transistor were fabricated. The gate width L was 0.2 micron, 0.3 micron and 0.5 micron, and the gate length W was 20 microns, 30 microns and 50 microns. For each sample, a voltage bias of 0.4 V was applied between gate electrode 47 and source electrode 48, and the resulting current I from gate electrode 47 to source electrode 48 was measured. Thus the dependence of I on the size and shape of the gate electrode 47 was determined. These data were analyzed as follows.

When a constant gate-to-source bias is applied, the dependence of I on gate electrode 47 size and shape is expressed as $$(I/LW) = \sigma + (2/L)\lambda w + (2/W)\lambda L \qquad \text{Equation 6}$$

where σ(sigma), λw, and λL are current densities. The first term of equation 6 represents current flowing through the interior area of the gate electrode 47, and the second and third terms represent current flowing through the perimeter of the gate electrode 47. λw is the linear current density flowing through segments of the perimeter with length W. These segments are directed toward source or drain electrode. λL is the linear current density flowing through segments of the perimeter with length L. These segments are directed toward neither source electrode 48 nor drain electrode 49.

Figure 13:
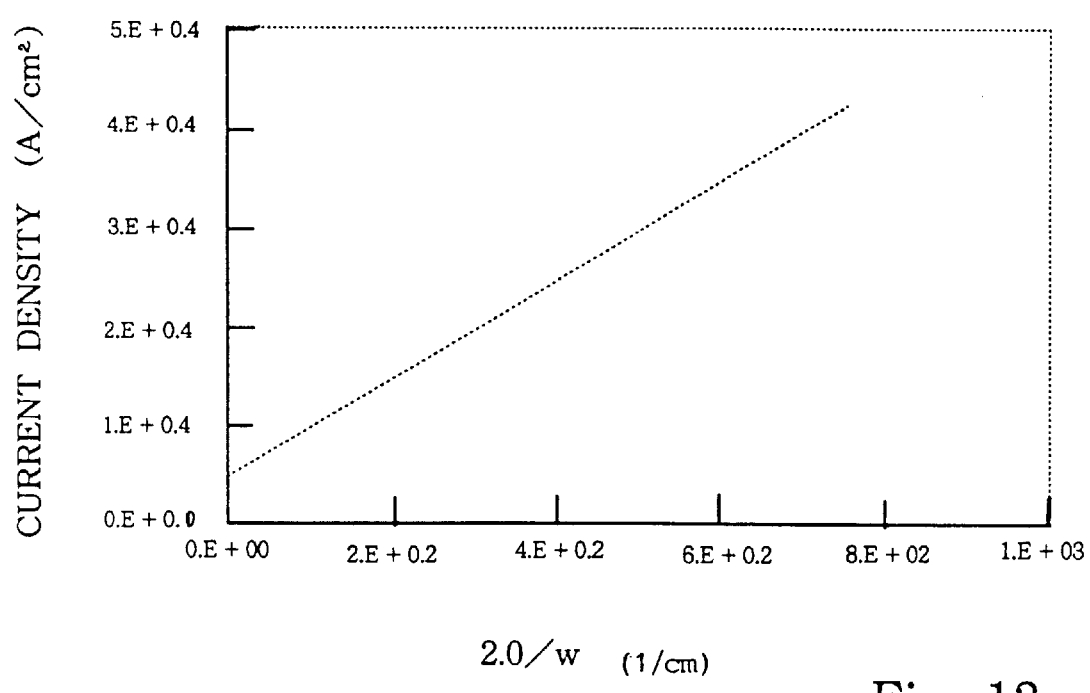
FIG. 13 is a graph showing the relation between the current density of gate current and a unit gate length.

To evaluate λL, the measured current density I/LW was plotted as a function of (2/W), with constant L, as illustrated in FIG. 13. According to Equation 6, the gradient is equal to λL, and the intercept on the current density axis is (σ+2λw/L). The gradient λL was 50 ampere/cm, and the intercept (σ+2λw/L) was 4000 ampere/square centimeter. From FIG. 13, it was observed that the current density λL dominated the gate current I. Therefore it was inferred that most of I flowed through the end surface of the gate, i.e., the surface not directed to the source electrode 48 nor the drain electrode 49. Furthermore, it was inferred this large current at the end of the gate electrode 47 was caused by direct contact between the gate electrode 47 and the channel layer 43 due to the mesa insulating structure, as illustrated in FIG. 12. The device structure was changed to isolate the gate electrode 47 from the channel region 43. As a result, I decreased and the device characteristics were improved.

Thus, the principle is applicable to the analysis on the Schottky electrode or a gate electrode of field effect transistor. The analyst does not require any expensive system, nor a large amount of time and labor. The analysis according to the present invention is economical.

Third Embodiment

Figure 14:
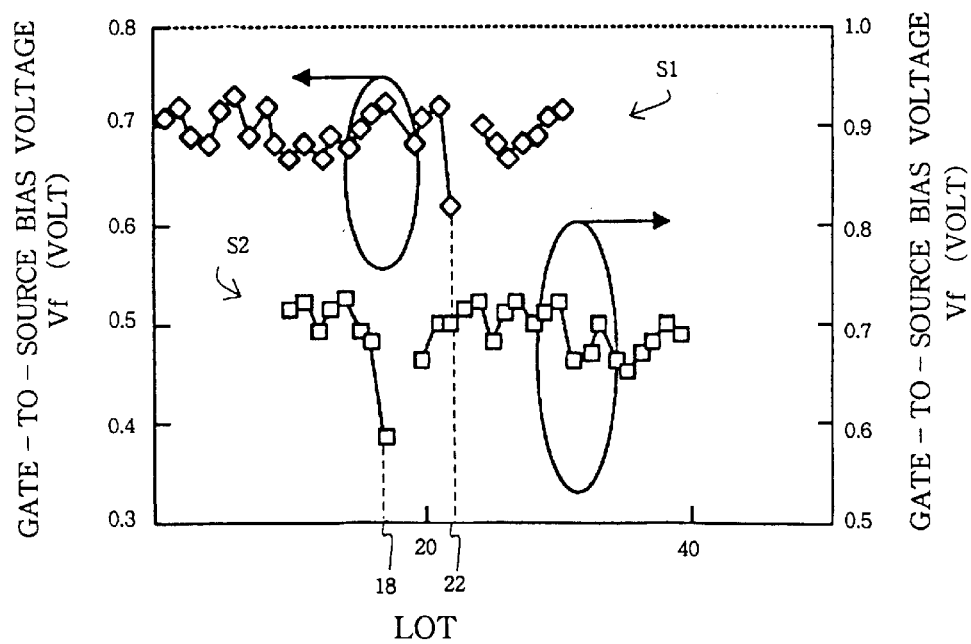
FIG. 14 is a graph showing a gate-to-source bias voltage of two series of products.

The analysis is available for a trouble shooting. Lot numbers were assigned to two series S1, S2 of products (field effect transistors). The forward breakdown voltage Vf of the products was measured. Vf was defined as "a gate voltage for flowing a gate current I of 1 milliampere at unit channel width, i.e., 1 millimeter". Vf was plotted in FIG. 14. The Vf of the first series S1 was indicated by the axis of coordinates on the left side, and Vf of the second series S2 was indicated by the axis of coordinates on the right side. If the value of Vf was less than 0.62 V, the product was judged to be defective. The product assigned the lot number 22 was defective in the first series S1, and the product assigned the lot number 18 was also defective in the second series S2.

Figure 15:
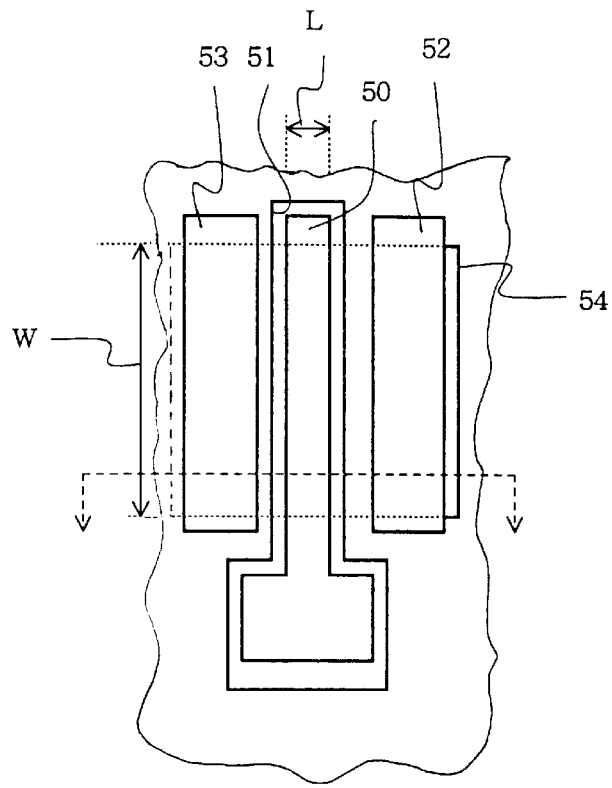
FIG. 15 is a plane view showing the layout of electrodes in a heterojunction field effect transistor.

The products of the two series S1/S2 were a heterojunction field effect transistor shown in FIG. 15. Reference numeral 50 designates a gate electrode of Ti/Au/Pt formed in a gate recess 51, and a source electrode of AuGe/Au alloy and a drain electrode of AuGe/Au alloy are labeled with references 52 and 53, respectively. In FIG. 15, 54 indicates a mesa insulating structure.

The gate length L of the products was 0.20 micron, 0.25 micron and 0.35 micron, and the gate width W of the products was 50 microns, 100 microns and 200 microns. The different kinds of products were concurrently produced. For each kind of product, the gate-to-source bias voltage Vgs was varied, and the resulting gate current I was measured. Thus the dependence of I on gate electrode 50 shape and size was determined. These data were analyzed as follows.

The dependence of the I on gate electrode 50 shape at fixed Vgs was expressed as $$(I/LW) = \sigma + (2/L)\lambda w + (2/W)\lambda L \qquad \text{Equation 7}$$

where σ (sigma), λw, and λL are current densities. The first term of Equation 6 represents current flowing through the interior area of the gate electrode 50, and the second and third terms represent current flowing through the perimeter of the gate electrode 50. λw is the linear current density flowing through segments of the perimeter with length W. These segments are directed toward source or drain electrode. λL is the linear current density flowing through segments of the perimeter with length L. These segments are directed toward neither source electrode 53 nor drain electrode 54.

Using equation 7, the present inventor determined the current densities σ, λw and λL by least squares fitting to the measured data. The current density λL was negligible, and the current density σ, and the current density λw were plotted in FIGS. 16 and 17.

Figure 16:
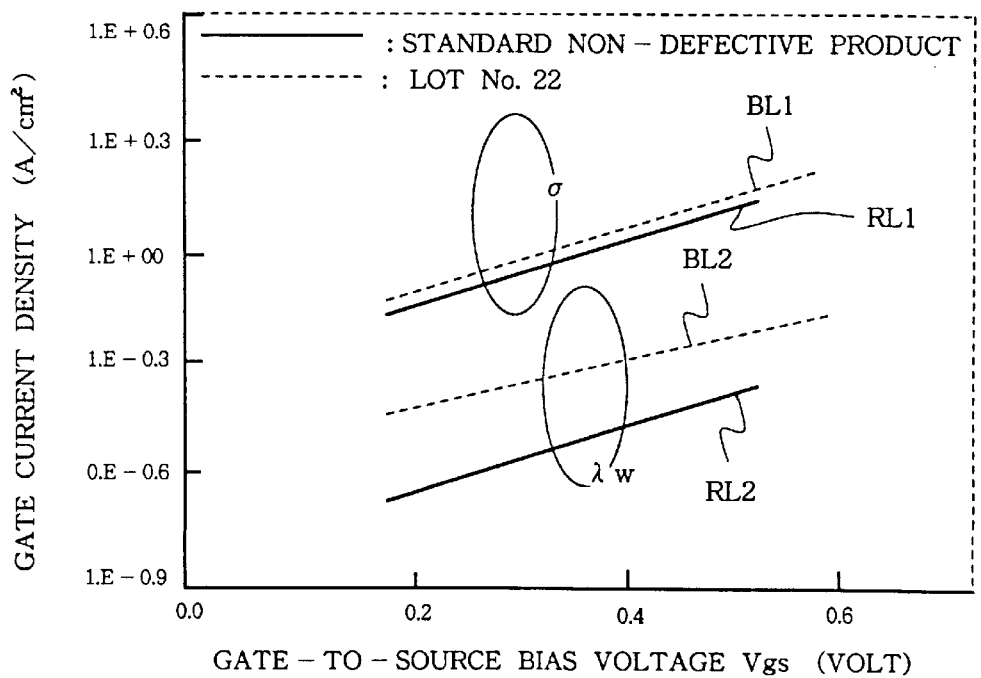
FIG. 16 is a graph showing the relation between a gate current density and a gate-to-bias voltage.

In FIG. 16, the defective product assigned the lot number 22 had the current density σ indicated by broken line BL1 and the current density λw indicated by broken line BL2. On the other hand, a standard non-defective product of the series S1 had the current density σ indicated by real line RL1 and the current density λw indicated by real line RL2. Comparing the broken lines BL1/BL2 with the solid lines R1/R2, it was understood that the current density λw was much larger in the defective product than the standard non-defective product. The analyst concluded that the side surface of the gate electrode 47 related to the trouble, i.e., the small Vf.

Figure 18:
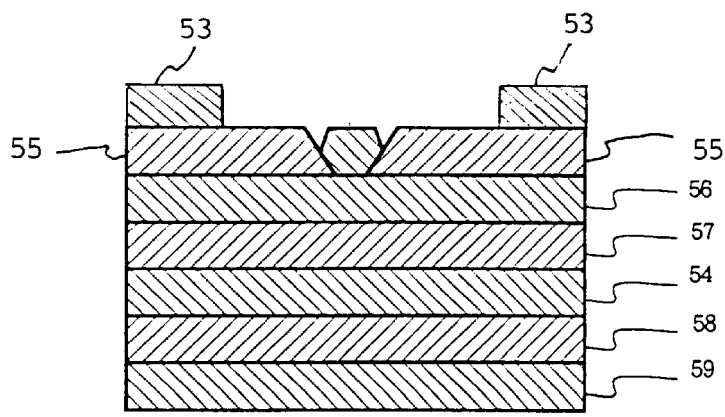
FIG. 18 is a cross sectional view showing the structure of a defective product.

The analyst broke the defective product assigned the lot number 22, and observed the cross section by scanning electron microscopy. The analyst found that the side surfaces of the gate electrode 50 were held in contact with a contact layer 55 of GaAs as shown in FIG. 18. The gate current was leaked through the side surfaces to the contact layer 55, and the defective product increased the gate current density λw due to the leakage. In FIG. 18, references 56, 57, 58 and 59 designate a Schottky layer of GaAlAs, an electron supply layer of GaAlAs, a buffer layer of GaAlAs and a substrate of GaAs, respectively. The analyst isolated the gate electrode 50 from the contact layer 55 in subsequent lots. The gate-to-source voltage Vf was increased over the critical value. Thus, the analysis was available for the trouble shooting.

Figure 17:
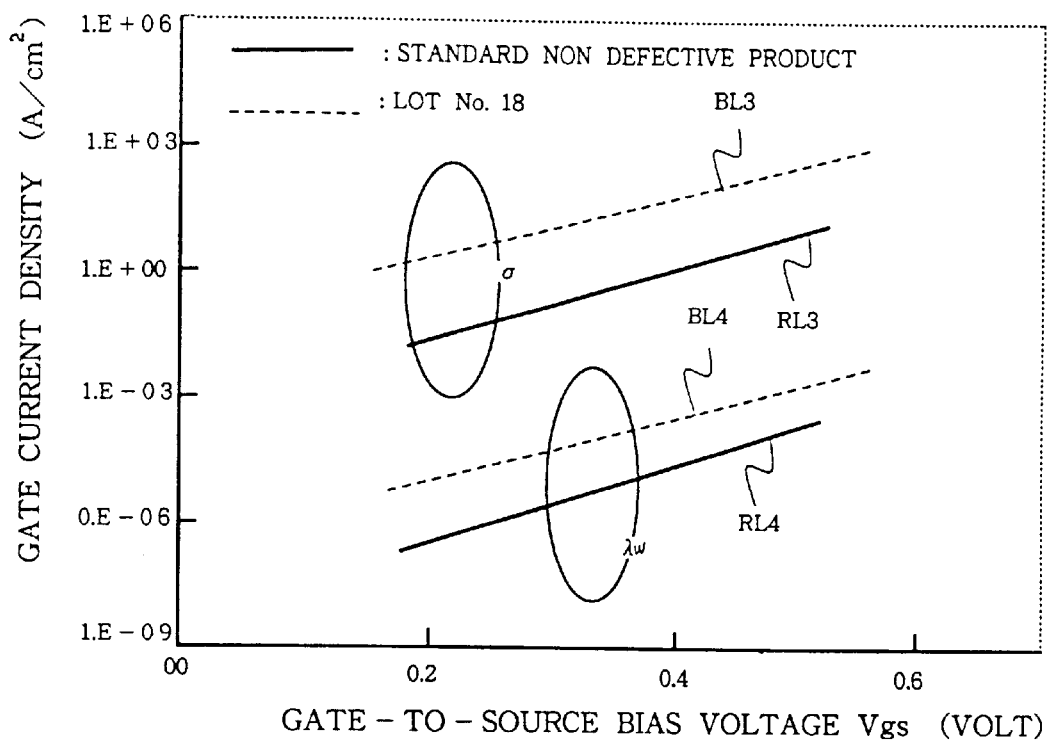
FIG. 17 is a graph showing the relation between a gate current density and a gate-to-source bias voltage.

In FIG. 17, the defective product assigned the lot number 18 had the current density σ indicated by broken line BL3 and the current density λw indicated by broken line BL4. On the other hand, a standard non-defective product of the series S2 had the current density σ indicated by real line RL3 and the current density λw indicated by real line RL4. Comparing the broken lines BL3/BL4 with the real lines R3/R4, the difference in the current density σ between the defective product and the non-defective product was larger than the difference in the current density λw between the defective product and the standard non-defective product.

The analyst broke the defective product assigned the lot number 18, and checked the dopant profile in the Schottky layer 56 and the electron supply layer 57, using secondary ion mass spectroscopy. The dopant impurity had been diffused from the electron supply layer 57 into the Schottky layer 56. The analyst concluded that this diffusion had caused the low Vf. The analyst arranged to prevent this diffusion in subsequent lots. Then, the gate-to-source bias voltage Vf was increased over the critical value.

As illustrated above, the analysis allows one to locate the source of excess current and to infer the cause. The analysis does not require the expensive apparatus, nor a large amount of time and labor. The analysis is economical. More expensive, prior art methods like scanning electron microscopy or secondary ion mass spectroscopy may be used more efficiently, because the analysis indicates which portion of the product should be examined.

Alternatively, these prior art methods may be omitted.

Fourth Embodiment

I–V characteristics are predicted for a gate electrode of a heterojunction field effect transistor. The heterojunction field effect transistor had a gate electrode of 0.15 micron long (L) and 100 microns wide (W) and a heterojunction between a GaAlAs layer and a GaInAs layer.

In order to improve gain in the millimeter wavelength, it was necessary to decrease L from 0.2 microns to 0.15 microns, and the gate current I as a function of gate-source bias voltage L=0.15 microns were required for the circuit design work. However, when the design work was started, no hetero junction field effect transistors with L=0.15 microns were available. Therefore, the characteristics were estimated as follows.

Samples of heterojunction field effect transistors with gate length L 0.20 micron, 0.25 micron and 0.35 micron, and the gate width W of 50 microns, 100 microns and 200 microns were prepared. For each sample, various biases were applied between the gate and source electrodes, and the resulting gate current I was measured. Thus the dependence of I on gate electrode shape and size was determined. Next, the current densities σ, λw and λL were determined using the measured data and the method of the first embodiment. Next, the I–V characteristics at L=0.15 microns and W=100 microns were estimated by using the following equation.

$$I = LW\sigma + 2W\lambda w + 2L\lambda L \qquad \text{Equation 8}$$

Figure 19:
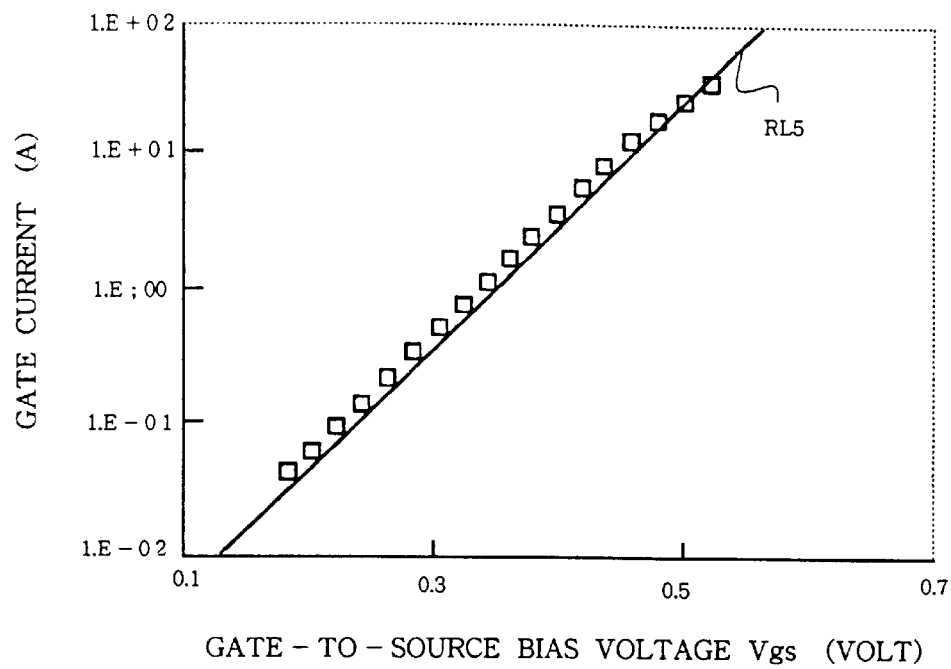
FIG. 19 is a graph showing the relation between a gate current to a gate-to-source bias voltage.

The result is indicated by the solid line RL5 in FIG. 19. This estimate allowed the circuit design to proceed.

When samples with L=0.15 microns became available, the dependence of I on gate to source voltage bias was measured, and is represented by the squares in FIG. 19. Thus, the measured gate current was close to the estimated gate current.

The I–V characteristics are quickly estimated, and a time and labor for the design work is reduced. The estimation is limited to the gate structure in a gate recess which is not substantially changed by the gate width L.

Fifth Embodiment

The gate length L0 of a heterojunction field effect transistor was estimated as follows. The current densities σ, λw and λL were determined by using samples of the heterojunction field effect transistor with known gate dimensions, according to the method of the first embodiment. The gate length L was 0.20 micron, 0.25 micron and 0.35 micron, and the gate widths W was 50 microns, 100 microns and 200 microns.

Thus the dependence of the gate current I on gate shape and size was expressed as $$I/WL = \sigma + 2\lambda w/L + 2\lambda L/W \qquad \text{Equation 9}$$

Figure 20:
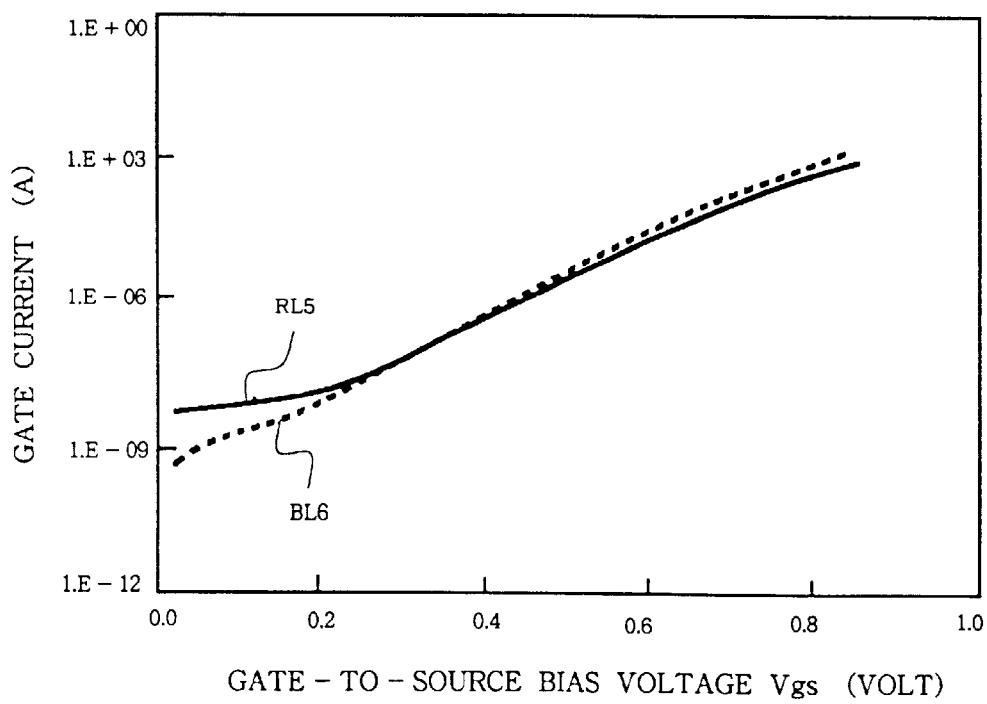
FIG. 20 is a graph showing the relation between a gate current and a gate-to-source bias voltage.

A sample had an unknown gate width L0. The gate length W0 was known, and was 100 microns. The gate current as a function of gate to source bias voltage were measured for the sample. Using an adaptation parameter L0, the characteristics of the sample were fitted to Equation 9 by the least squares method. As a result, L0 was estimated to be 0.23 micron. FIG. 20 shows the gate current as a function of gate to source bias voltage. The dashed line BL6 is the result of fitting with Equation 9. The solid line is the measured data.

Thus, the analysis according to the present invention is available for the estimation of gate dimensions. The manufacturer can promptly modify a fabrication process, and the cost for the analysis is very low.

What is claimed is:

1. A method for analyzing an electrical contact between different component members incorporated in a semiconductor device, comprising the steps of:

a) conceptually dividing said contact into a set of N regional elements each representative of a line or a region forming a part of said contact, where N is a natural number greater than 2;

b) preparing sample devices, containing component members including at least said electrical contact, with the size of the regional elements varying amongst the samples;

c) fitting the current passing through said contact to the following equation as a linear function of $R_k$ under a fixed biasing condition $$I(R1, R2, \cdots, R_N) = \sum_{k=1}^{N} J_k R_k$$

where I is said current, $R_k$ is a length of said line or an area of said region, and the fitting parameter $J_k$ is a current density passing through said regional element represented by $R_k$; and thus d) determining current components $J_k$ of said current respectively each passing through said line or said region so as to analyze said contact.

2. The method as set forth in claim 1, in which one of said component members is a gate electrode of a field effect transistor, and one of said regional elements is representative of an edge of an end surface of said gate electrode not directed to a source electrode of said field effect transistor or to a drain electrode of said field effect transistor.

3. The method as set forth in claim 1, in which one of said component members is a gate electrode of a field effect transistor, and one of said regional elements is representative of an edge of a side surface of said gate electrode directed to a source electrode of said field effect transistor or a drain electrode of said field effect transistor.

* * * * *

UNITED STATES PATENT AND TRADEMARK OFFICE
CERTIFICATE OF CORRECTION

PATENT NO. : 6,172,513 B1
DATED : January 9, 2001
INVENTOR(S) : Walter Contrata

Page 1 of 1

It is certified that error appears in the above-identified patent and that said Letters Patent is hereby corrected as shown below:

Column 6,
Line 66, delete "$L^N ac, A^N acb, A^N bcc,...A^N cdc$" insert -- $L^N ac, A^N aeb, A^N bce, ...A^N cde$ --

Signed and Sealed this

Thirtieth Day of October, 2001

Attest:

NICHOLAS P. GODICI
Attesting Officer   Acting Director of the United States Patent and Trademark Office